United States Patent
Bal

(10) Patent No.: US 6,646,465 B2
(45) Date of Patent: Nov. 11, 2003

(54) PROGRAMMABLE LOGIC DEVICE INCLUDING BI-DIRECTIONAL SHIFT REGISTER

(75) Inventor: Ankur Bal, Ghaziabad (IN)

(73) Assignee: STMicroelectronics Ltd., Uttar Pradesh (IN)

( * ) Notice: Subject to any disclaimer, the term of this patent is extended or adjusted under 35 U.S.C. 154(b) by 0 days.

(21) Appl. No.: 10/072,461

(22) Filed: Feb. 7, 2002

(65) Prior Publication Data

US 2002/0113618 A1 Aug. 22, 2002

(30) Foreign Application Priority Data

Feb. 9, 2001 (IN) .............................. 139/2001

(51) Int. Cl.[7] .............................. G11C 19/00; G06F 7/38
(52) U.S. Cl. .............................. 326/40; 326/46; 377/81
(58) Field of Search .............................. 326/40, 41, 46, 326/47, 44, 49, 113; 377/64, 79, 81

(56) References Cited

U.S. PATENT DOCUMENTS 5,889,413 A   3/1999  Bauer ........................ 326/40
5,995,988 A  11/1999  Freidin et al. .............. 708/232
6,018,559 A  * 1/2000  Azegami et al. ............. 377/79

* cited by examiner

Primary Examiner—Daniel Chang
(74) Attorney, Agent, or Firm—Lisa K. Jorgenson; Allen, Dyer, Doppelt, Milbrath & Gilchrist, P.A.

(57) ABSTRACT

A programmable logic device may include a programmable interconnect structure and a plurality of configurable logic elements including data latches interconnected by the interconnect structure. At least one of the configurable logic elements may be configurable as both a shift register and a lookup table. Also, the shift register may be enabled to operate as a bi-directional shift register by the inclusion of a first circuit for configuring the data latches either as series-connected inverters during a shift operation or as data latches after each shift operation. A second circuit for selecting a direction of shifting may also be included, as well as a third circuit for supplying data to the input of the shift register as determined by the direction of shifting.

31 Claims, 3 Drawing Sheets

PROGRAMMABLE LOGIC DEVICE INCLUDING BI-DIRECTIONAL SHIFT REGISTER

FIELD OF THE INVENTION

This invention relates to the field of electronic circuits, and, more particularly, to a programmable logic device including a bi-directional shift register.

BACKGROUND OF THE INVENTION

Conventional field-programmable gate arrays (FPGAs) use re-programmable lookup tables for implementing functions having n inputs, where n depends on the lookup table size and the addressing scheme involved. Such a lookup table can normally implement $2^{2^n}$ logic functions. A logic function may or may not use all the inputs to the lookup table. A few of the logic functions that may be accommodated in the lookup table include AND, NAND, OR, NOR, XOR, XNOR and mixed combinations of these functions. It may also be desirable to implement a shift register functionality within the logic element (lookup table) to maximize the flexibility of the lookup table.

U.S. Pat. No. 5,889,413 to Bauer discloses one prior art approach for using lookup tables as shift registers. The key elements that enable shift operation are a pass transistor/CMOS transmission gate and an inverter which connect the latches in the lookup table structure. Although such an arrangement enables shift operation within the lookup table, it does so only in one direction. It does not have any provision for shifting the data bits in both directions. This limits its usage to applications involving unidirectional shift operations. Thus, this approach fails to accommodate applications involving bi-directional shift operations.

SUMMARY OF THE INVENTION

An object of the invention is to provide a programmable logic device including a bi-directional shift register.

This and other objects, features, and advantages in accordance with the present invention are provided by a programmable logic device which may include a programmable interconnect structure and a plurality of configurable logic elements including data latches interconnected by the interconnect structure. At least one of the configurable logic elements may be configurable as both a shift register and as a lookup table. Furthermore, the shift register may operate as a bi-directional shift register by the inclusion of first means or circuitry for configuring the data latches either as series connected inverters during shift operations or as data latches after each shift operation. In addition, second means or circuitry for selecting a direction of shifting may also be included, as well as third means or circuitry for supplying data to the input of the shift register as determined by the direction of shifting.

More particularly, the first means may include first and second sets of switches (or transmission gates) connected between the inverters of each latch and between each latch and each subsequent latch in the selected direction of shifting in the shift register chain, respectively. Their arrangement may be such that the first set of switches connect the inverters as latches during normal operation, while during a shift operation the second set of switches connect one inverter of each latch to an inverter of the subsequent latch for transferring data. The second and third means may include logic gates, e.g., metal oxide semiconductor (MOS) gates.

The above programmable logic device may further include control logic for controlling shifting when the configurable logic element is configured as a bi-directional shift register. The control logic may include a user clock terminal for controlling shifting of data between the plurality of data latches. Further, second control logic may also be included for controlling the manner in which the logic elements are configured as a bi-directional shift register.

The second control logic may include a first coupling means or device for coupling a data input terminal to either the first data latch or to the last data latch depending on the selected direction of shifting. In addition, a second coupling means or device may be included for coupling a data output terminal to the output of any of said data latches.

The second coupling means may include selection means or circuitry for selecting one or more of the outputs of the data latches as the final output, and the selection means may include one or more decoders. Also, multiple programmable logic devices may be interconnected to implement a bi-directional shift register of a length greater than the size of a single programmable device.

BRIEF DESCRIPTION OF THE DRAWINGS

The invention will now be described with reference to the accompanying drawings, in which.

DETAILED DESCRIPTION OF THE PREFERRED EMBODIMENTS

Figure 1:
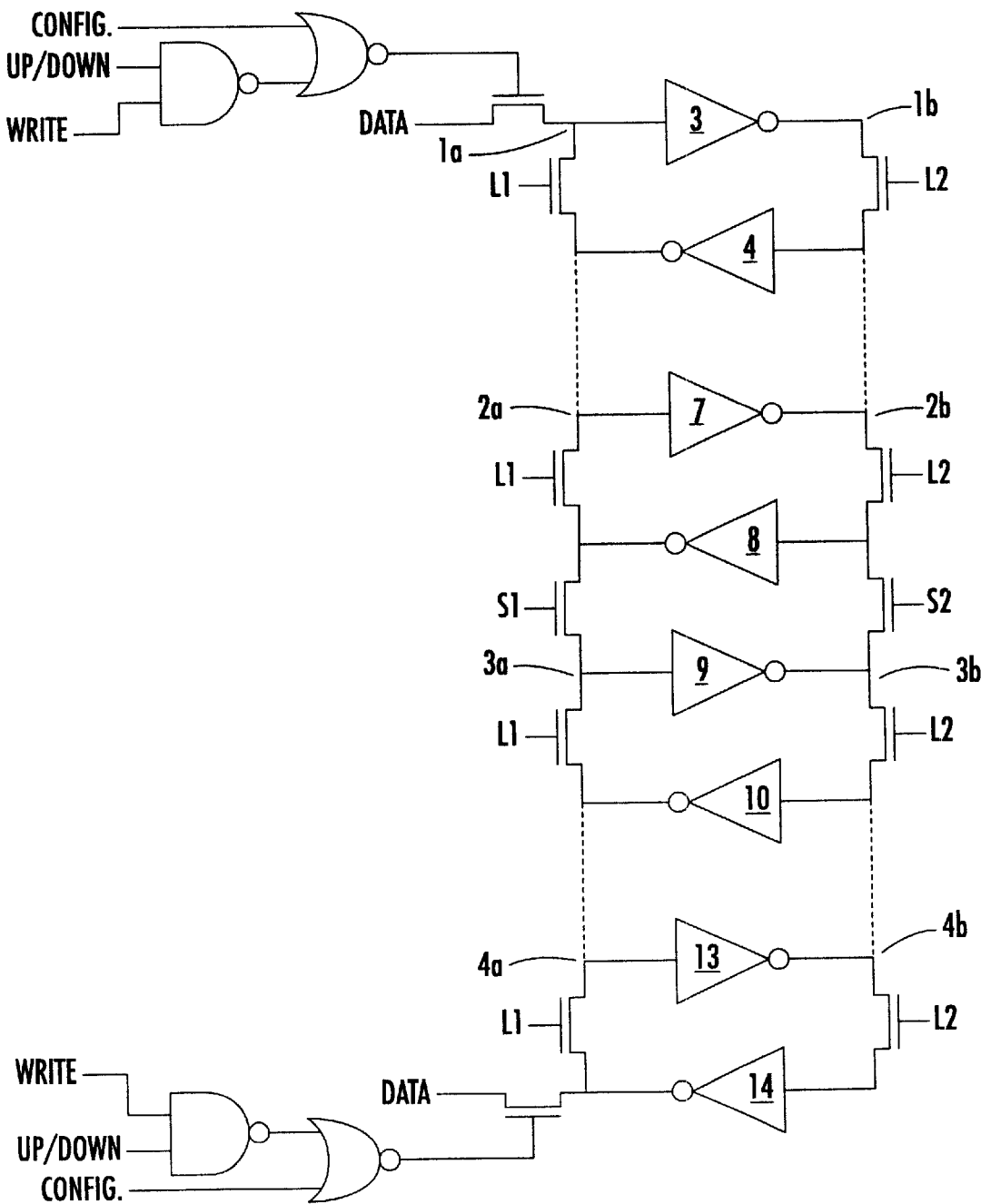
FIG. 1 is a schematic diagram of a programmable logic device with a bi-directional shift register according to the present invention implemented using logic gates.

Referring initially to FIG. 1, a preferred embodiment of the proposed architecture for the logic block of the present invention is illustratively shown. The read-write terminals and associated circuitry are not shown, but these are well known to those skilled in the art. As may be seen, inverter pairs 7-8, 9-10, 11-12, 13-14 are a part of the logic block structure that includes many such inverter pairs extending in both directions. Thus, the inverter pair can be visualized as part of an inverter stack connected by pass transistors. When this logic block is used as a RAM or as a lookup table without any shifting ability, the L1 and L2 pins are permanently pulled up, and the S1 and S2 pins are permanently pulled down. The inverter pairs 7-8, 9-10 and others behave like latches as the feedback paths are closed. The inverter pairs mentioned throughout this description are those inverter pairs which are used to latch data. In other words, the inverter pairs are those two inverters which are connected by pass transistors having gate signals L1 and L2.

Figure 2:
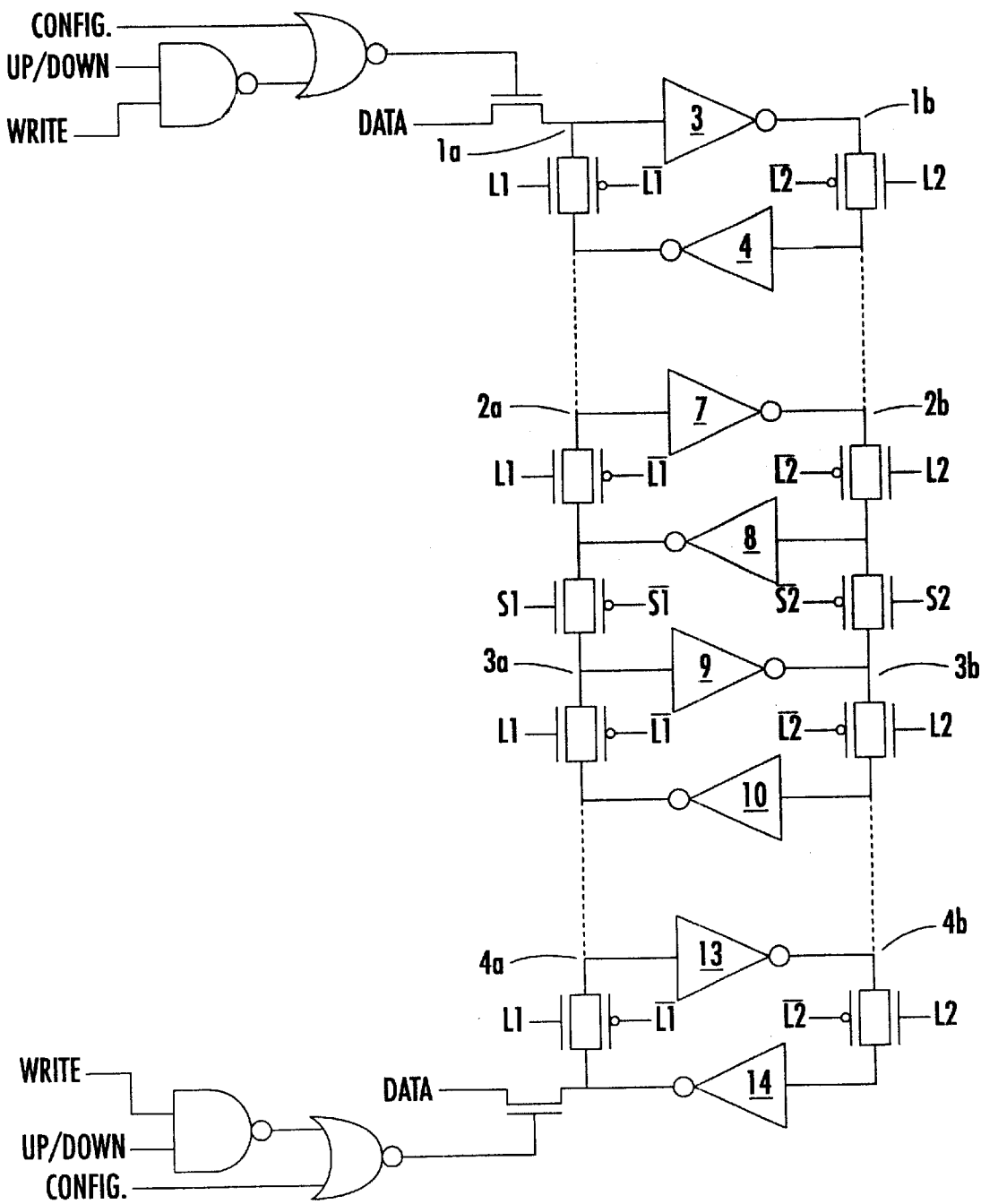
FIG. 2 is a schematic block diagram of an alternate embodiment of the programmable logic device of FIG. 1 implemented using transmission gates.

The inverter pairs are carefully designed to minimize the static power dissipation in the inverters due to a Vt drop of the NMOS pass transistors. The inverter pairs at the top and bottom of this stack may receive or output data bits depending on the mode of operation. Another embodiment is possible in which the pass transistors are replaced by CMOS transmission gates (FIG. 2). During a configuration or RAM mode, the inverter latch pairs may be fed data from nodes 1a, 1b, etc. While using the logic block as a RAM, lookup table or a shift register (explained later), the data may be read from the inverter pairs from nodes 1b, 2b, etc.

Figure 3:
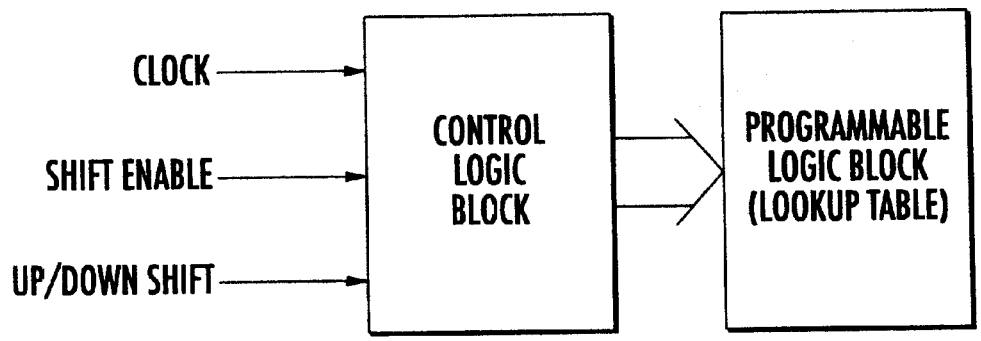
FIG. 3 is a schematic block diagram of the programmable logic device according to the invention.

The data word on the address decoder for the lookup table determines the length of the shift register. The shift register length that can be implemented within a single lookup table is limited by the number of inverter pairs in the logic block. When the logic block is to be used as a shift register, a mechanism is described by which data in the lookup table, which is made of inverter pair latches, will shift into adjacent inverter pair latches when a shift signal (normally a clock signal) is applied. This shift signal is applied to a control logic block (FIG. 3) which generates the appropriate signals for data shift. As will be seen, the control logic block can be designed in many ways by those skilled in the art.

The inputs to the control logic block are the clock signal, the shift enable signal and the up/down signal. A single shift operation is executed upon applying the clock signal, provided the shift enable signal is at the correct level (high or low, depending on the design). The shift enable signal initiates the shift mode operation of the lookup table. Further, an up/down signal determines the direction of data shift. As will be appreciated by those skilled in the art, signals to the control logic block can be changed in real time, i.e., the post configuration period. This implies that a logic block can be used as an LUT, an up shift register, or a down shift register even after configuration. Thus, complex functionality involving dynamic operations may be implemented.

Another advantage provided by the present invention is the simplification of the placement and routing tools. That is, the input to output direction constraint while placement of a shift register is eliminated. This is so because of the availability of the data input port of the shift register on either side of the lookup table.

To realize shift registers of length greater than the lookup table size, the invention also provides an array of such programmable blocks which are interconnected and may be programmable. The interconnection therebetween would link all such programmable blocks to form a chain of inverter pairs. Further understanding of the present invention and implementation of the same will be better understood based on the following description.

Referring again to FIG. 1, a programmable logic block includes a plurality of inverters and pass transistors interconnected as shown. This programmable logic block basically includes n latches, where n stands for the number of bits that can be stored in the programmable logic block. The latches are formed by inverter pairs and connecting pass transistors. Data is written into the latches through an addressing scheme and read in a similar manner. Any addressing scheme may be used, which are well known to those skilled in the art and not discussed here for clarity of explanation.

Data is normally written directly into the latches during configuration, RAM write mode operation, or shift operation. Data is normally read from the latches during RAM read mode operation, lookup table operation, or shift operation. During configuration, RAM mode, or lookup table operations, data is normally read/written depending on the word on the address line. In shift mode write operation, data is written either into the topmost latch in the stack or into the bottom most latch in the stack. Data is read through the addressing scheme for the lookup table during shift mode read operation.

Operation of the proposed logic block as a shift register is as follows. First, depending on the operation desired, latches in the logic block may or may-not be configured during configuration. Second, the word on the address line determines the length of the shift register. The word may be static or dynamic depending on the type of application. The input latch (at the top or bottom) and the latch which is addressed define the boundaries of the shift register, and the shift register length is the total number of latches between the input latch (at the top or bottom) and the latch which is addressed, with both the aforementioned boundary latches included.

Moreover, the shift operation may be visualized as a first-in, first-out (FIFO) operation with the input latch (at the top or bottom) as the input port and the LUT output as the output port. Also, the shift operation is preferably executed only if there is a clock input and a shift enable signal to the control block. The control block generates the necessary waveforms for the shift operation, depending on the up/down shift signal. In addition, the waveforms illustratively shown in FIG. 5 delineate a single down-shift sequence operation for the shift register type lookup table in FIGS. 1 and 2.

Figure 4:
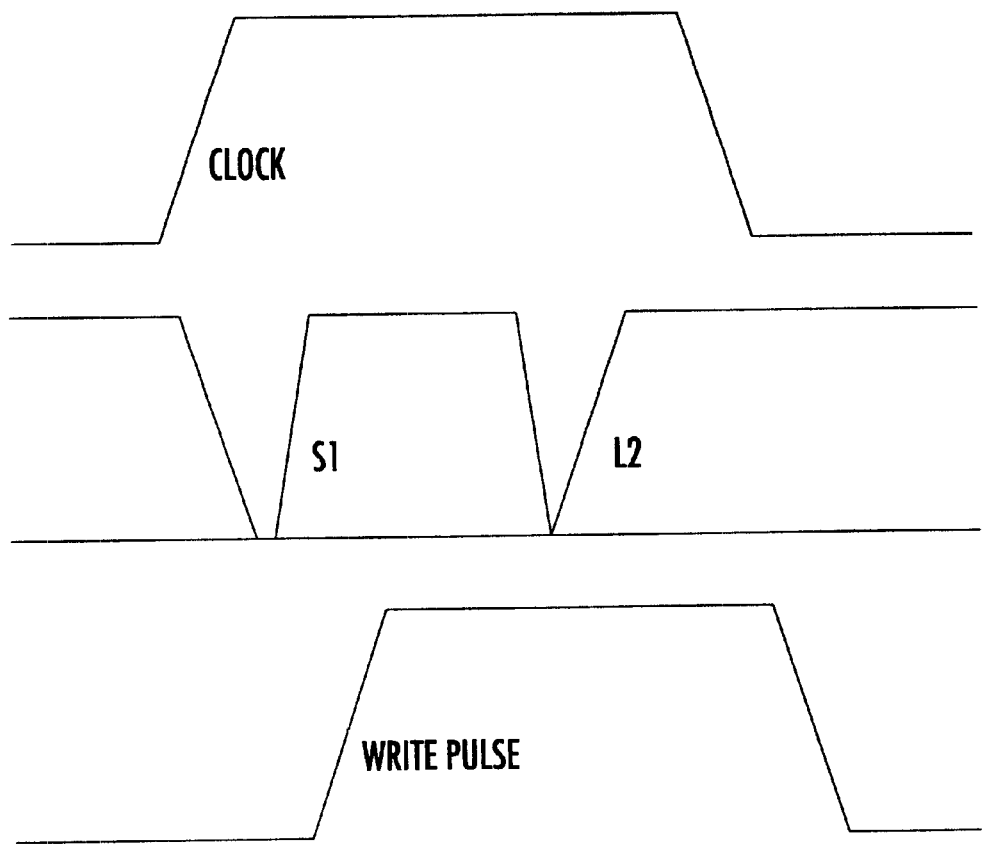
FIG. 4 is a waveform diagram illustrating sample waveforms for a single down-shift sequence in accordance with the present invention.

In the case of a single down shift operation, this implies that data stored in the latch formed by inverters 7 and 8 (FIGS. 1 and 2) has to be shifted into the latch formed by inverters 9 and 10. A clock signal (with shift enable active) initiates the shifting process. Now, referring to FIG. 4, L1 and L2 are pulled down with the arrival of the clock signal. This follows S1 taking a logic high value, and S1 is kept high until the adjacent inverter 10 below the present inverter 9 stabilizes its output. Once data is passed on to the inverter below, S1 goes low and L2 goes high. L1 goes high after the data is well settled into the inverter 10.

The control logic block generates L1, L2, S1, S2, and Writepulse. During configuration the control block ensures that all L1, L2 are high, all S1, S2 are low, and the pass transistors (for data) at the top and bottom of the inverter stack are off. Thus, a novel logic block structure with bi-directional shifting capability is described.

That which is claimed is:

1. A programmable logic device comprising:
a plurality of configurable logic elements each comprising a data latch, and each data latch comprising a plurality of inverters, at least one of said configurable logic elements being configurable as both a bi-directional shift register and a lookup table;
a programmable interconnect structure connecting said plurality of configurable logic elements together;
first means for configuring said configurable logic elements as series connected inverters during a shift operation and as data latches thereafter;
second means for selecting a direction of shifting; and
third means for supplying data to an input of said bi-directional shift register based upon the direction of shifting.

2. The programmable logic device according to claim 1 wherein said first means comprise:
a first set of switches connected between said inverters of each data latch; and
a second set of switches connected between each data latch and each subsequent data latch in the selected direction of shifting;
said first sets of switches connecting respective inverters as data latches during normal operation, and said second sets of switches connecting one inverter of each data latch to an inverter of a subsequent data latch for data transfers during shift operations.

3. The programmable logic device according to claim 2 wherein said first and second sets of switches comprise first and second sets of transmission gates.

4. The programmable logic device according to claim 1 wherein each of said second and third means comprise at least one of logic gates and pass transistors.

5. The programmable logic device according to claim 4 wherein said logic gates comprise metal oxide semiconductor (MOS) logic gates.

6. The programmable logic device according to claim 1 further comprising control logic for controlling shifting when said at least one configurable logic element is configured as the bi-directional shift register.

7. The programmable logic device according to claim 6 wherein said control logic comprises a user clock terminal for controlling shifting of data between a plurality of said data latches.

8. The programmable logic device according to claim 1 further comprising control logic for controlling the configuration of said at least one configurable logic element as the bi-directional shift register.

9. The programmable logic device according to claim 8 wherein said control logic comprises:
   first coupling means for selectively coupling a data input of the programmable logic device to a first one of the data latches and to a last one of said data latches based upon the selected direction of shifting; and
   second coupling means for coupling a data output terminal of the programmable logic device to an output of at least one of said data latches.

10. The programmable logic device according to claim 9 wherein said second coupling means comprise at least one decoder for selecting the output of said at least one data latch.

11. A programmable logic device comprising:
   a plurality of configurable logic elements each comprising a data latch, and each data latch comprising a plurality of inverters, at least one of said configurable logic elements being configurable as both a bi-directional shift register and a lookup table;
   first circuitry for configuring said configurable logic elements as series connected inverters during a shift operation and as data latches thereafter;
   second circuitry for selecting a direction of shifting; and
   third circuitry for supplying data to an input of said bi-directional shift register based upon the direction of shifting.

12. The programmable logic device according to claim 11 wherein said first circuitry comprises:
   a first set of switches connected between said inverters of each data latch; and
   a second set of switches connected between each data latch and each subsequent data latch in the selected direction of shifting;
   said first sets of switches connecting respective inverters as data latches during normal operation, and said second sets of switches connecting one inverter of each data latch to an inverter of a subsequent data latch for data transfers during shift operations.

13. The programmable logic device according to claim 12 wherein said first and second sets of switches comprise first and second sets of transmission gates.

14. The programmable logic device according to claim 11 wherein each of said second and third circuitry comprises at least one of logic gates and pass transistors.

15. The programmable logic device according to claim 11 further comprising control logic for controlling shifting when said at least one configurable logic element is configured as the bi-directional shift register.

16. The programmable logic device according to claim 15 wherein said control logic comprises a user clock terminal for controlling shifting of data between a plurality of said data latches.

17. The programmable logic device according to claim 11 further comprising control logic for controlling the configuration of said at least one configurable logic element as the bi-directional shift register.

18. The programmable logic device according to claim 17 wherein said control logic comprises:
   a first coupler for selectively coupling a data input of the programmable logic device to a first one of the data latches and to a last one of said data latches based upon the selected direction of shifting; and
   at least one second coupler for coupling a data output terminal of the programmable logic device to an output of at least one of said data latches.

19. The programmable logic device according to claim 18 wherein said at least one second coupler comprises at least one decoder for selecting the output of said at least one data latch.

20. An electronic device comprising:
   a plurality of programmable logic devices connected together to form a bi-directional shift register having a length greater than a length of an individual programmable logic device, each programmable logic device comprising
   a plurality of configurable logic elements each comprising a data latch, and each data latch comprising a plurality of inverters, at least one of said configurable logic elements being configurable as both a bi-directional shift register and a lookup table,
   first circuitry for configuring said configurable logic elements as series connected inverters during a shift operation and as data latches thereafter,
   second circuitry for selecting a direction of shifting, and
   third circuitry for supplying data to an input of said bi-directional shift register based upon the direction of shifting.

21. The electronic device according to claim 20 wherein said first circuitry comprises:
   a first set of switches connected between said inverters of each data latch; and
   a second set of switches connected between each data latch and each subsequent data latch in the selected direction of shifting;
   said first sets of switches connecting respective inverters as data latches during normal operation, and said second sets of switches connecting one inverter of each data latch to an inverter of a subsequent data latch for data transfers during shift operations.

22. The electronic device according to claim 21 wherein said first and second sets of switches comprise first and second sets of transmission gates.

23. The electronic device according to claim 20 wherein each of said second and third circuitry comprises at least one of logic gates and pass transistors.

24. The electronic device according to claim 20 wherein each programmable logic device further comprises control logic for controlling shifting when said at least one configurable logic element is configured as the bi-directional shift register.

25. The electronic device according to claim 24 wherein said control logic comprises a user clock terminal for controlling shifting of data between a plurality of said data latches.

26. The electronic device according to claim 20 wherein each programmable logic device further comprises control logic for controlling the configuration of said at least one configurable logic element as the bi-directional shift register.

27. The electronic device according to claim 26 wherein said control logic comprises:

a first coupler for selectively coupling a data input of each programmable logic device to a first one of its respective data latches and to a last one of its respective data latches based upon the selected direction of shifting; and at least one second coupler for coupling a data output terminal of each programmable logic device to an output of at least one of its respective data latches.

28. The electronic device according to claim 27 wherein said at least one second coupler comprises at least one decoder for selecting the output of said at least one data latch.

29. A method for using a programmable logic device comprising a plurality of configurable logic elements each comprising a data latch, each data latch comprising a plurality of inverters, and at least one of the configurable logic elements being configurable as both a bi-directional shift register and a lookup table, the method comprising:

selecting a direction of shifting;

supplying data to an input of the bi-directional shift register based upon the direction of shifting; and configuring the configurable logic elements as series connected inverters during a shift operation and as data latches thereafter.

30. The method according to claim 29 further comprising connecting respective inverters of each data latch as data latches during normal operation, and connecting one inverter of each data latch to an inverter of a subsequent data latch for performing data transfers during shift operations.

31. The method according to claim 29 further comprising controlling a configuration of the at least one configurable logic element as the bi-directional shift register by:

selectively coupling a data input of the programmable logic device to a first one of the data latches and to a last one of the data latches based upon the selected direction of shifting; and coupling a data output terminal of the programmable logic device to an output of at least one of the data latches.

\* \* \* \* \*